United States Patent [19]

Marinace

[11] 4,178,197
[45] Dec. 11, 1979

[54] FORMATION OF EPITAXIAL TUNNELS UTILIZING ORIENTED GROWTH TECHNIQUES

[75] Inventor: John C. Marinace, Yorktown Heights, N.Y.

[73] Assignee: International Business Machines Corporation, Armonk, N.Y.

[21] Appl. No.: 17,230

[22] Filed: Mar. 5, 1979

[51] Int. Cl.$^2$ .................. H01L 21/20; H01L 21/467; H01L 21/76

[52] U.S. Cl. .................... 148/175; 29/576 E; 29/578; 29/580; 148/1.5; 148/174; 156/612; 156/647; 357/20; 357/55; 357/56; 357/60; 357/88; 350/96 WG

[58] Field of Search .................. 148/174, 175, 1.5; 156/612, 647; 350/96 WG; 156/647; 29/576 E, 578, 580; 357/20, 55, 56, 60, 88

[56] References Cited

U.S. PATENT DOCUMENTS

| | | | |
|---|---|---|---|
| 3,425,879 | 2/1969 | Shaw et al. | 148/175 |
| 3,621,346 | 11/1971 | Chang et al. | 357/60 X |
| 3,813,585 | 5/1974 | Tarui et al. | 357/60 |
| 3,855,690 | 12/1974 | Kim et al. | 29/578 X |
| 3,884,733 | 5/1975 | Bean et al. | 148/175 |
| 3,998,672 | 12/1976 | Miyoshi et al. | 148/171 |
| 4,056,413 | 11/1977 | Yoshimura | 148/175 |
| 4,066,482 | 1/1978 | Shaw | 148/175 |
| 4,071,383 | 1/1978 | Nagata et al. | 148/175 |

OTHER PUBLICATIONS

Canavello et al., "Vapor Grown III-V Compound Inlays", I.B.M. Tech. Discl. Bull., vol. 6, No. 2, Jul. 1963, p. 86.

Shaw, D. W., "Influence of Substrate Orientation . . . . Growth Rates", Proc. 1968 Symposium on GaAs, paper No. 8, pp. 50-53.

Tausch et al., "Novel Crystal Growth . . . GaAs . . . Onto Silicon Dioxide", J. Electrochem. Soc., vol. 112, No. 7, Jul. 1965, pp. 706-709.

Iida et al., "Morphological Studies on Selective Growth of GaAs", J. Crystal Growth 13/14 (1972), pp. 336-341.

Primary Examiner—L. Dewayne Rutledge
Assistant Examiner—W. G. Saba
Attorney, Agent, or Firm—Alvin J. Riddles

[57] ABSTRACT

Epitaxial tunnels may be formed in crystalline bodies of crystalline materials by growth of the material on a substrate having two intersecting crystallographic planes that exhibit rapid epitaxial growth and by maintaining the growth until the structure forming along those planes closes, thereby producing a tunnel. P-n junction structures can be made in semiconductor devices by appropriate techniques.

4 Claims, 4 Drawing Figures

4,178,197

FORMATION OF EPITAXIAL TUNNELS UTILIZING ORIENTED GROWTH TECHNIQUES

DESCRIPTION

1. Technical Field

The invention is in the manufacture of very small devices of the order of 3 to 100 micrometers which may be used for some examples, as cooling tunnels, in transistor semiconductor devices as light emission devices, for various optical purposes, as ink jet nozzles, as charge electrodes, as channel electronic multipliers and as cathodes for cathode ray tubes. The tunnel structures are triangular and are surrounded by monocrystalline material.

2. Background Art

The formation of epitaxial semiconductor structures wherein preferential growth planes and employed have been known in the field for same time. Two illustrative examples are U.S. Pat. Nos. 3,884,733 and 3,855,690 wherein arrays of devices having particular shapes useful for optical purposes are formed by growing epitaxial material on a substrate using a crystallographic plane that exhibits preferential growth and which provides an optically desirable face. Heretofore in the art, however, the region produced by the preferential growth plane has been exposed.

DISCLOSURE OF INVENTION

In crystal growth processes such as chemical vapor deposition, there is a growth rate dependence on the different crystallographic planes of the crystalline structure being produced. Where the growth is performed on a substrate that is oriented such that two crystallographic planes that exhibit preferential growth intersect, a tunnel or a void in the resulting crystal structure can be produced.

In some crystal structures such as the III-V intermetallic compounds, the growth rate difference between one crystallographic plane and another can be as much as a factor of 100.

The tunnels or voids produced may be on the order of ~3 to 100 micrometers in width and are useful in a variety of instances such as where hard or chemically inert material of that size is desirable or where, since the material is of the semiconductor type, various light emitting properties can be imparted to the structure and thus the tunnels can be employed for optical transmission purposes.

BEST MODE FOR CARRYING OUT THE INVENTION

The substrate is selected with a crystallographic orientation on which the growth of the crystalline structure is to be performed such that there will be two intersection high growth rate planes.

Figure 1:
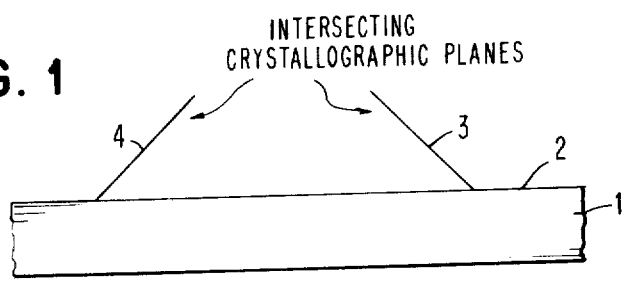
FIG. 1 is a schematic of a relationship between three crystallographic planes which are a condition for the practice of the invention.

Referring to FIG. 1, the substrate 1 would be a monocrystalline material having a crystallographic orientation such that the face 2 on which the growth was to take place would have intersecting it two crystallographic planes 3 and 4 which would grow from the face 2. Under these conditions were the growth to be maintained long enough, the intersecting planes 3 and 4 would meet. Where the planes 2, 3 and 4 exhibit preferential growth, the intersection occurs rapidly.

Figure 2:
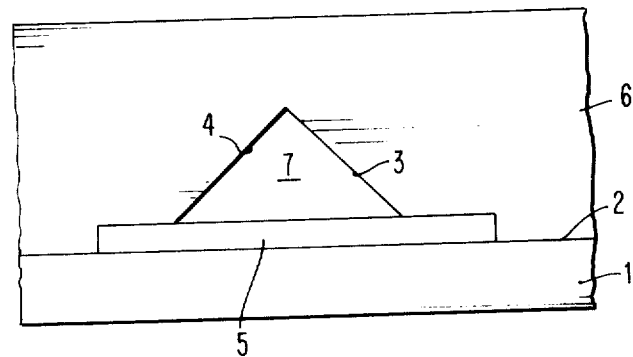
FIG. 2 is a cross-sectional view of an epitaxial tunnel structure.

Referring now to FIG. 2, the substrate 1 has a growth inhibiting shape defining material 5, usually of a growth inhibiting resist, in a proper shape placed on the surface 2. The surface 2 is of a crystallographic orientation such that preferential planes 3 and 4 will intersect thereby forming an enclosed structure 6 having therein a void or tunnel 7. The tunnel 7 may be any shape configured by the initial resist 5 that is applied to the substrate 1.

While the invention is applicable to any crystalline material that can have two intersecting preferential growth planes, the intermetallic semiconductor compounds in the III-V and II-VI categories exhibit ease of preferential growth when the substrate face 2 is of the [100] crystallographic orientation and the intersecting planes 3 and 4 are the [111B] crystallographic planes.

Continuing to refer to FIG. 2, in fabrication, the substrate 1 may be of the III-V category such as gallium arsenide having a narrow stripe of about 3 micrometers to 100 micrometers shown as element 5. This may, for example, be of $SiO_2$, $Al_2O_3$ or Mo. The crystalline material 6 is then grown in accordance with the standard vapor growth techniques using a GaAs source and HCl as a transport agent.

The $HCl + H_2$ is passed over pieces of GaAs source material at 850° C. to transport it to the substrate which is maintained at 750° C.

A GaAs wafer substrate oriented nominally 3° off a [100] crystallographic plane toward the [110] crystallographic plane is chemically polished with $Br_2$-methanol and is provided with a film of 200 nm of $SiO_2$ or $Al_2O_3$. The stripe 5 is patterned on the oxide film using photoresist with the axis of the stripe being in one of the [110] crystallographic directions on the [100] crystallographic planes, that is, the planes that form an acute angle with the stripe 5 and as epitaxial material is formed the void is ultimately covered. The wider the oxide stripe 5, the larger the bore of the void or tunnel will be. Tunnels having sides 3 to 100 micrometers are the general order of relative size.

It should be noted that the stripe 5 extends beyond the intersection of the planes 3 and 4 with the surface 2. This is done to accommodate the fact that as the slow growing planes propagate in a direction toward each other, the fast growing planes are closing the void or tunnel 7. The selection of the width of the stripe 5 should be done with this in consideration.

In the semiconductor intermetallic compounds, the III-V compounds gallium arsenide and gallium phosphide and the III-VI compound zinc selenide are preferred.

In the case of the III-V composed gallium arsenide, the depositing GaAs does not nucleate on molybdenum, consequently Mo stripes may be also used in such a situation in addition to the other examples of silicon dioxide and aluminum oxide. Mo is inert in halogen chemical vapor deposition reactions.

An empirical method for choosing the [110] crystallographic directions on the [100] crystallographic substrate surface of the example gallium arsenide has been devised. A GaAs wafer with an oxide film on the polished surface is immersed in a 3:1:1:$H_2O$:$H_2O_2$:$NH_4OH$ solution for about 3 minutes. Wherever there is a pin hole in the oxide an etch pit with an elongated outline formed. If the oxide stripes are parallel to the long axis of the pit, the tunnels of the invention will result. When, however, the stripes are perpendicular to the long axis, grooves will result. If a pin hole in the oxide cannot be found, the etch figures on the bottom of the wafer are rotated 90° from those on top and they can be used as a guide. If the stripe axes are in each of the <100> directions in the {100} surface, vertical walls will result.

As an example of an elemental crystal, tunnels or voids may also be formed in the material silicon by placing narrow stripes in either of the [110] directions on a [100] crystallographic surface of the substrate. The difference in growth rates is not as pronounced in elemental crystals as it is in intermetallic crystals. As taught in U.S. Pat. No. 3,884,733 discussed above, the [113] crystallographic plane is one of the faster growing planes in silicon.

Further, the tunnels of the invention in addition to their uses in forming shapes in hard material also have a particular advantage in the semiconductor field where a p-n junction is incorporated in the structure.

Figure 3:
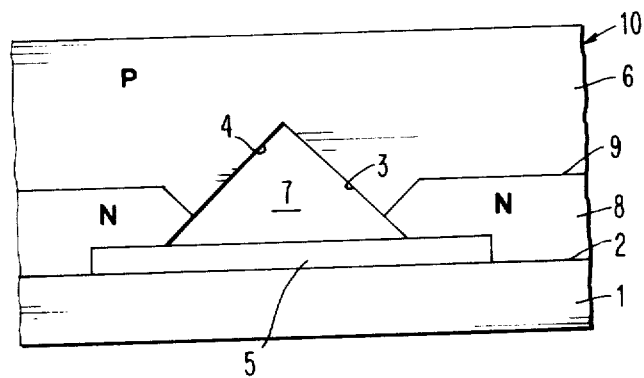
FIG. 3 is a cross-sectional view of an epitaxial tunnel structure involving a p-n junction.

This may be seen in FIG. 3 wherein the substrate 1 has grown thereon the surface 2, an n-region 8 which forms a p-n junction 9 with a p-region 10 so that the edges of the p-n junction 9 are exposed in the planes 3 and 4 in the cavity 7. This provides light emitting properties in the tunnel.

Since the tunnel can be tapered by tapering the resist 5 in manufacture, point sources of light may be easily provided which in turn can be electrically modulated.

Thus a wide variety of very precisely fabricated electro-optical structures ave available.

Figure 4:
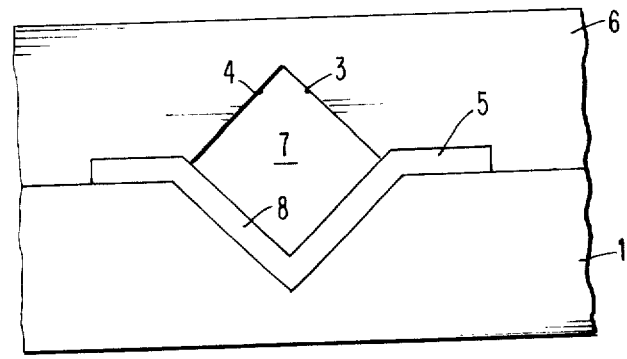
FIG. 4 is a cross-sectional view of an epitaxial tunnel structure illustrating variation in cross-sectional shape.

It will be apparent to one skilled in the art that void or tunnel cross sections other than triangular may be provided by, for example, grooving the substrate in the first instance. Such an example for silicon or gallium arsenide is shown in FIG. 4 wherein all reference numerals have been maintained and a groove 8 is provided in the [100] oriented substrate and the stripe 5 is laid down in and adjacent to the groove 8.

What has been described is a technique of producing tunnel shaped voids in crystalline materials by using the fact that two preferential growth planes can be caused to intersect and create a void in the grown crystal.

Having described the invention, what is claimed as new and what is desired to secure by letters patent is:

1. The process of providing epitaxial tunnels in monocrystalline structures comprising the steps of:
    providing a crystalline substrate having a surface thereof with a crystallographic orientation such that there are two preferential growth crystallographic planes that intersect said substrate surface and intersect each other;
    providing a void delineating resist pattern on said substrate and epitaxially growing a crystal of said material along said planes until intersection has taken place.

2. The process of claim 1 including the steps of inserting a p-n junction in said grown material.

3. The process of claim 1 wherein said resist pattern is a member of the group of $SiO_2$, $Al_2O_3$ and Mo.

4. The process of claim 1 wherein said resist pattern is tapered providing thereby a point light source.

* * * * *